United States Patent
Bammer et al.

(10) Patent No.: US 9,329,252 B2
(45) Date of Patent: May 3, 2016

(54) APPARATUS FOR REAL-TIME PHASE CORRECTION FOR DIFFUSION-WEIGHTED MAGNETIC RESONANCE IMAGING USING ADAPTIVE RF PULSES

(75) Inventors: Roland Bammer, Stanford, CA (US); Anh Tu Van, San Francisco, CA (US); Rafael O'Halloran, Philadelphia, PA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 746 days.

(21) Appl. No.: 13/600,146

(22) Filed: Aug. 30, 2012

(65) Prior Publication Data

US 2013/0229177 A1 Sep. 5, 2013

Related U.S. Application Data

(60) Provisional application No. 61/575,889, filed on Aug. 30, 2011.

(51) Int. Cl.
*G01R 33/56* (2006.01)
*G01R 33/563* (2006.01)
*G01R 33/565* (2006.01)
*G01R 33/561* (2006.01)
*G01R 33/567* (2006.01)

(52) U.S. Cl.
CPC .......... *G01R 33/56* (2013.01); *G01R 33/56341* (2013.01); *G01R 33/56509* (2013.01); *G01R 33/5614* (2013.01); *G01R 33/5676* (2013.01)

(58) Field of Classification Search
USPC .......................... 324/300–322; 600/407–435; 382/128–131
See application file for complete search history.

(56) References Cited

U.S. PATENT DOCUMENTS

| | | | |
|---|---|---|---|
| 6,853,191 B1 | 2/2005 | Miller et al. | |
| 7,348,776 B1 | 3/2008 | Aksoy et al. | |
| 7,408,345 B2 | 8/2008 | Bammer et al. | |
| 7,417,427 B2 | 8/2008 | Porter | |
| 8,406,849 B2 * | 3/2013 | Jeong et al. | 600/410 |
| 8,781,197 B2 * | 7/2014 | Wang et al. | 382/131 |
| 8,934,694 B2 * | 1/2015 | Chen et al. | 382/131 |
| 2007/0182411 A1 * | 8/2007 | Bammer et al. | 324/307 |
| 2007/0249929 A1 * | 10/2007 | Jeong et al. | 600/410 |

(Continued)

OTHER PUBLICATIONS

Nunes et al., "Prospective Correction of Spatially Non-Linear Phase Patterns for Diffusion-Weighted FSE Imaging Using Tailored RF Excitation Pulses", May 2011, Proc. 19th Annual Meeting of the International Society for Magnetic Resonance in Medicine.

(Continued)

*Primary Examiner* — Melissa Koval
*Assistant Examiner* — Tiffany Fetzner
(74) *Attorney, Agent, or Firm* — Lumen Patent Firm

(57) ABSTRACT

Phase error in MR imaging is corrected in real time by providing adaptive RF pulses and corresponding adaptive magnetic field gradients to mitigate the effect of phase error in the imaging subject. A real time phase error map is obtained, and then adaptive RF pulses and corresponding field gradients are applied that remove the problematic effects of the phase error. Depending on details of the MR imaging mode being employed, there are several ways this removal can be done. Phase error can be cancelled by providing RF pulses that make the phase in the imaging subject uniform. Another approach is to make the adaptive RF pulses insensitive to the phase errors that are present.

9 Claims, 8 Drawing Sheets

(56) References Cited

U.S. PATENT DOCUMENTS

| | | | |
|---|---|---|---|
| 2010/0280353 A1* | 11/2010 | Roth et al. | 600/410 |
| 2011/0044524 A1* | 2/2011 | Wang et al. | 382/131 |
| 2012/0025825 A1 | 2/2012 | Porter | |
| 2012/0121124 A1 | 5/2012 | Bammer et al. | |
| 2013/0049756 A1* | 2/2013 | Ernst et al. | 324/322 |
| 2013/0158384 A1* | 6/2013 | Jeong et al. | 600/410 |
| 2013/0182932 A1* | 7/2013 | Chen et al. | 382/131 |
| 2013/0187650 A1* | 7/2013 | Pfeuffer et al. | 324/322 |
| 2013/0229177 A1* | 9/2013 | Bammer et al. | 324/309 |

OTHER PUBLICATIONS

Von Mengershause et al., "3D diffusion tensor imaging with 2D navigated turbo spin echo", 2005, pp. 206-216, MAGMA v18.

* cited by examiner

Type 1 Error ($\phi_{TRi} \neq 0$)   Type 2 Error (Magnitude loss)

APPARATUS FOR REAL-TIME PHASE CORRECTION FOR DIFFUSION-WEIGHTED MAGNETIC RESONANCE IMAGING USING ADAPTIVE RF PULSES

CROSS REFERENCE TO RELATED APPLICATIONS

This application claims the benefit of U.S. provisional patent application 61/575,889, filed on Aug. 30, 2011, entitled "An Apparatus for Real-Time Phase Correction for Diffusion-Weighted Magnetic Resonance Imaging Using Adaptive RF Pulses", and hereby incorporated by reference in its entirety.

GOVERNMENT SPONSORSHIP

This invention was made with Government support under contracts EB011654, EB006526, and EB008706 awarded by the National Institutes of Health. The Government has certain rights in this invention.

FIELD OF THE INVENTION

This invention relates to magnetic resonance imaging.

BACKGROUND

Patient motion, including the gross translation and rotation and the cardiac pulsation, in the presence of strong diffusion-encoding gradients can cause a spatially non-linear phase distribution at the end of a diffusion-preparation period. This spatially non-linear phase distribution can affect image encoding and decoding, and can also interact with the radio frequency (RF) pulses to create artifacts.

Although methods are known for dealing with the effect of a spatially non-linear phase distribution on image encoding and decoding (e.g., by performing retrospective correction to the image after it is obtained), it is considerably more difficult to mitigate the effect of phase errors on the RF pulses. Accordingly it would be an advance in the art to provide improved real time correction of phase errors in MR imaging.

SUMMARY

The present approach is based on obtaining a real time phase error map, and then applying, in real-time, RF pulses and accompanied gradients that remove the problematic effects of the phase error. Depending on details of the MR imaging mode being employed, there are several ways this removal can be done. In a first approach, the phase error is directly cancelled in real time (0 degree phase cancellation RF pulse, and corresponding gradient waveforms). Here a zero degree pulse means no net nutation of the magnetization, while correcting the phase of the spins at each point in space so that spin phase is equal across the imaging field of view. Another approach is to compute, in real time, phase-insensitive echo-reset RF pulses (and corresponding gradient waveforms) for phase insensitive diffusion encoding preparation. Here an echo-reset pulse is an RF pulse that restores the magnetization along the longitudinal axis. A third approach is to compute, in real time, refocusing RF pulses and corresponding gradient waveforms for RF refocused imaging (such as fast spin echo imaging). Another approach is to compute, in real time, excitation RF pulses and corresponding gradient waveforms for diffusion-weighted steady state free precession (dwSSFP) acquisition.

This approach provides significant advantages. 1) Regular RF pulses nutate spins around a given axis which is defined by the direction of the B1 excitation field. The effective nutation of the spins depends on the phase angle between the spin phase and the phase of the RF pulse. Variations between these phases in space can lead to errors in the flip angle and subsequently to imaging artifacts. Specifically, these phase differences between RF and spin phase will undesirably nutate spins in ways that differ from what is intended. As a result, different amounts of magnetization can remain in the transverse plane and the longitudinal axis, and lead to artifacts. Such artifacts can be avoided by adaptive RF pulses and field gradients of the present approach.

2) Conventional approaches for diffusion-weighted FSE imaging currently try to eliminate the signal instability caused by the non-CPMG component via phase-cycling and keeping refocusing pulse flip angles high. This generalized approach is not optimal for all non-linear phase errors. Moreover, the high flip angles are specific-absorption-rate (SAR)-intense, have a substantial magnetization transfer (MT) effect, and lead to a strong degradation of the slice profile at later echoes.

3) The phase-errors from diffusion-preparation are typically ignored in conventional driven-equilibrium sequences (i.e. sequences where the transverse magnetization is diffusion-prepared, then restored along the longitudinal plane, and then read out subsequently by a sequence such as but not limited to steady-state free precession (SSFP). A local phase difference between the spins and the echo-reset RF pulse leads to a very unpredictable signal magnitude. Averaging out motion has been the method of choice for this technique, thus far. 3) Real-time correction of motion-induced phase error has thus far been limited to 3D linear phase correction, so it would be advantageous to correct both linear and nonlinear phase error.

In an embodiment, an MRI system includes a main magnet configured to provide a main magnetic field, one or more gradient magnets configured to provide controllable magnetic field gradients, and one or more radio-frequency (RF) sources of RF emission configured to provide controllable RF pulses. The MRI system is operated to provide a navigator image of an imaging subject. A 2D or 3D phase error map is computed from the navigator image in real time. One or more adaptive RF pulses and one or more adaptive magnetic field gradients are computed to compensate for the phase error estimated in the phase error map. The adaptive RF pulses are automatically provided to the imaging subject by the RF sources and simultaneously the adaptive magnetic field gradients are provided to the imaging subject by the gradient magnets. Diffusion-weighted MRI of the imaging subject is performed using the adaptive RF pulses and adaptive magnetic field gradients.

Some embodiments of the invention feature phase cancellation, where the adaptive RF pulse compensates for the phase errors by making a post-pulse phase distribution in the imaging subject substantially uniform. Other embodiments relate to phase insensitivity, where the adaptive RF pulse compensates for the phase errors by making an RF tip axis map substantially equal to the phase error map. Phase insensitive adaptive RF pulses can be applied to various MR imaging modalities, including but not limited to: phase insensitive echo-reset pulses for phase insensitive diffusion encoding preparation; refocusing pulses for fast spin echo imaging; and excitation pulses for diffusion-weighted steady state free precession imaging.

A regular global phase term of the RF phase can be used for zero order phase correction. Preferably, the magnetic field gradients are used to compensate for linear error in the phase error map (i.e., 1st order errors in phase vs. position). Such first order magnetic field gradients can be determined from the 2D/3D phase error map, and then the adaptive 2D/3D RF pulses can be designed to compensate for the remaining phase error.

A common source of phase error is motion of the imaging subject in the presence of a strong gradient field, such as used for diffusion encoding. Such motion phase errors can include predictable errors (e.g., heartbeat) and random errors (e.g., head motion). In such cases, compensation of the random phase errors can be provided by the adaptive phases of the RF pulses and the adaptive magnetic field gradients, and compensation of the predictable errors can be provided by pre-computed RF pulses and pre-computed magnetic field gradients that are determined from a pre-estimate of the predictable errors.

DETAILED DESCRIPTION

A) General Principles

Figure 1A:
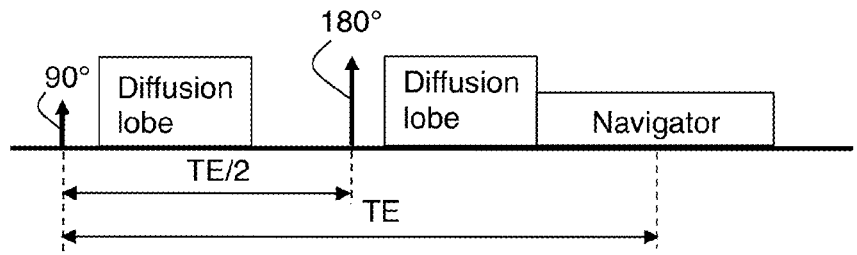
FIGS. 1a-b show exemplary diffusion preparation modules of diffusion-sensitive MRI sequences including a navigator.

This approach relates to a novel apparatus and/or method that can measure and correct spatially non-linear phase errors in real time via phase-compensating, multi-dimensional adaptive radio-frequency (RF) pulses. This approach expands the applicability of diffusion-weighted imaging from primarily single-shot echo planar imaging (EPI) to spatially less distorted acquisition methods, such as Fast Spin Echo (FSE), Driven-Equilibrium (DE) fast gradient recalled echoes or diffusion-weighted steady-state free precession (SSFP) imaging. Hence, both diffusion-weighted Periodically Rotated Overlapping ParallEL Lines with Enhanced Reconstruction (PROPELLER) or 3D methods, such as diffusion-weighted Sampling Perfection with Application optimized Contrasts using different flip angle Evolution (SPACE)/Volumetric Isotropic T2-weighted Acquisition (VISTA)/Cube Fast Spin Echo (FSE) or Driven Equilibrium-Steady State Free Precession (DE-SSFP), would greatly benefit from this approach. By virtue of quasi-real time phase measurements and computation of compensatory RF pulses, non-linear phase-errors can be mitigated that would otherwise create unwanted non-Carr-Purcell-Meiboom-Gill (non-CPMG) magnetization in FSE, incomplete echo-restoration in DE sequences, or Type II phase errors in diffusion-weighted SSFP (that propagate through multiple coherences pathways and cause destructive interferences during echo formation). This approach can be also used to correct and prevent non-linear phase-errors prior to image readouts, such as EPI, and avoids the need for phase correction during image reconstruction as well as mitigating errors from partial Fourier reconstructions.

The basic idea of this work is that one can design in real time individually adapted RF pulses to remove the spatially non-linear phase error "burned" into the transverse magnetization immediately after diffusion encoding so that in each point in space the axis of RF-rotation agrees with the orientation of the transverse magnetization, or in case of FSE only a CPMG component is generated.

Details of phase error compensation can depend on which MR imaging modality is under consideration. The following description briefly considers four examples, and section B of the detailed description provides and in-depth discussion relating to dwSSFP. From these examples, it will be clear to art workers how to apply principles of the present approach to any MR imaging modality.

Real time phase compensation can be divided into two categories. In the first category, phase errors as determined from the navigator are removed from the imaging subject by adaptive RF pulses. Since this approach removes the phase error from the imaging subject, it can be referred to as phase cancellation. Sometimes the term 0 degree phase cancellation is employed. The second category relates to tailoring the RF pulses such that the phase errors in the imaging subject do not negatively affect the MR imaging being performed. For example, such insensitivity can be achieved by making the RF tip axis (i.e., the magnetic field direction of the RF excitation) either parallel to or perpendicular to the spins in the imaging subject, depending on the imaging modality. In some cases, this amounts to making the RF tip axis at each point in space parallel to or perpendicular to the spin phases (i.e., the spin phase is defined with respect to precession of the spins). This approach can be referred to as phase-insensitive. In practice, these categories need not be exclusive, and a particular method may rely on phase cancellation and/or phase insensitivity.

An example of this approach can be separated into four parts: (1) acquisition of a 2D/3D navigator image; (2) computation of 2D/3D phase-error maps in real-time; (3a) real-time computation of a 2D/3D 0° phase-cancellation RF pulse and corresponding gradient waveforms; or (3b) real-time computation of a 2D/3D phase-insensitive (i.e. RF tip axis equals local spin phase) echo-reset pulse and corresponding gradient waveforms for phase-insensitive DE preparation; or (3c) real-time computation of 2D/3D refocusing pulses and corresponding gradient waveforms for regular FSE and advanced FSE (CUBE/VISTA/SPACE); or (3d) real-time computation of 2D/3D excitation pulses and corresponding gradient waveforms for diffusion-weighted steady state free precession (DW SSFP) acquisition (4) pulse sequence modifications to load and play out 2D/3D adaptive RF pulses in real-time on $n_{RF}$ RF-channels (here $n_{RF}$ is the number of RF transmit channels that can play independent RF waveforms) and adaptive gradients waveforms on one or more gradient channels.

Figure 1B:
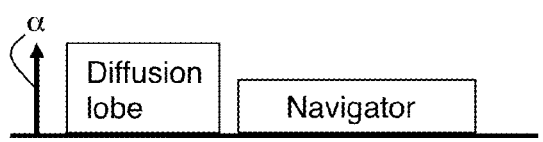

More Specifically:

(1) A (low-resolution) 2D/3D navigator can be applied immediately after the end of the second (fourth) diffusion-encoding lobe of a Stejskal-Tanner (Reese-Heid Dual Spin Echo) diffusion preparation (e.g., as shown on FIG. 1a) or after the end of the single diffusion encoding lobe of a SSFP diffusion preparation (e.g., as shown on FIG. 1b).

(2) 2D/3D phase error maps are computed from these navigators and a reference navigator in real time. If significant motion is detected between those two navigators an affine registration can be performed prior to the computation of phase maps.

Figure 2A:
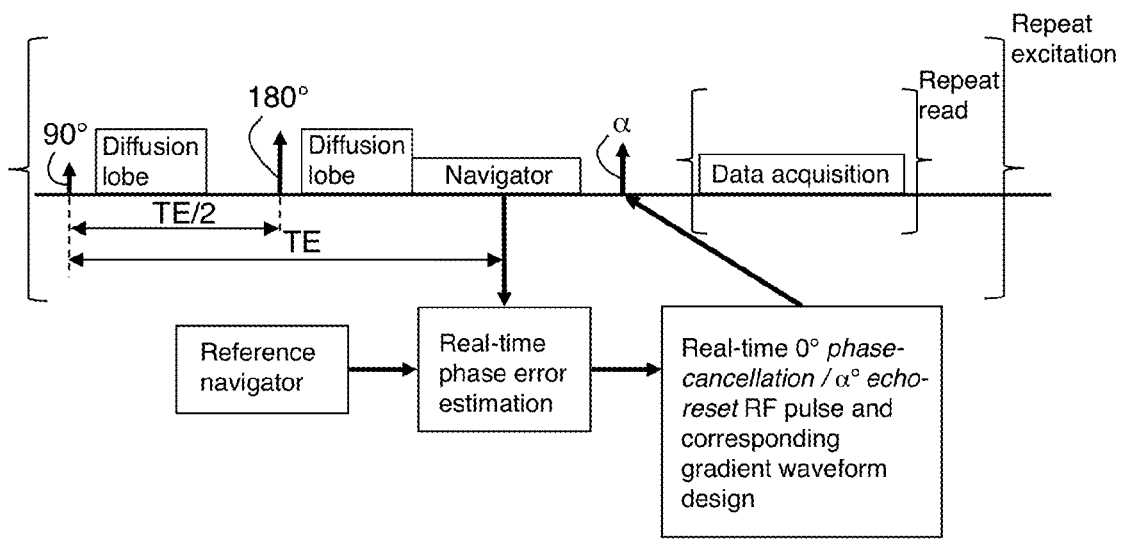
FIGS. 2a-c show exemplary real time phase error compensation methods according to embodiments of the invention.

Four Alternatives can be Considered:

(3a) In real-time, a 2D/3D 0° phase-cancellation RF pulse and its corresponding gradient waveforms can be computed (FIG. 2a). For example, multi-spoke pulses and spiral RF pulses can be used for 2D and 3D applications, respectively. These 2D/3D RF pulses are defined by both gradient and RF waveforms. First, the envelopes of the gradient waveforms (such as multi-spoke, EPI, spiral, stack of spirals) are chosen. These choices of the envelope depend on the desired properties of the resulting RF pulse: 2D, 3D, fast, robust to system imperfection. Then depending on the variation from pixel-to-pixel of the phase error that needs compensating, the magnitudes of the gradient waveforms are set accordingly. Next, for the RF waveform design, an approach inverse to the regular small tip angle or the iterative approach can be used. Notice that, here, rather than starting out with a zero-phase magnetization, one uses the measured transverse magnetization and calculates RF and gradient waveforms to reach the desired transverse magnetization magnitude and zero phase. To keep the RF pulse length short, exploit additional encoding and RF pulse tailoring capacity, and keep overall echo times (TEs) short, multiple transmitters with individually shaped RF waveforms can be used for parallel excitation.

(3b) Similar to 3a, a phase-insensitive (i.e. RF tip axis equals spin phase at each point in space) 2D/3D echo-reset pulse with corresponding gradient waveforms can be computed for phase-insensitive DE preparation in real time (FIG. 2a). For imaging that uses echo reset RF pulses, depending on the angle between the applied RF pulse and the spin, the magnitude of the reset magnetization (i.e., magnetization along the z direction) varies (FIG. 2d). Since this reset magnetization will later be gradually tipped down to the transverse plane for image formation, this undesirable magnitude variation leads to unpredictable image magnitude and hence artifacts.

Figure 2B:
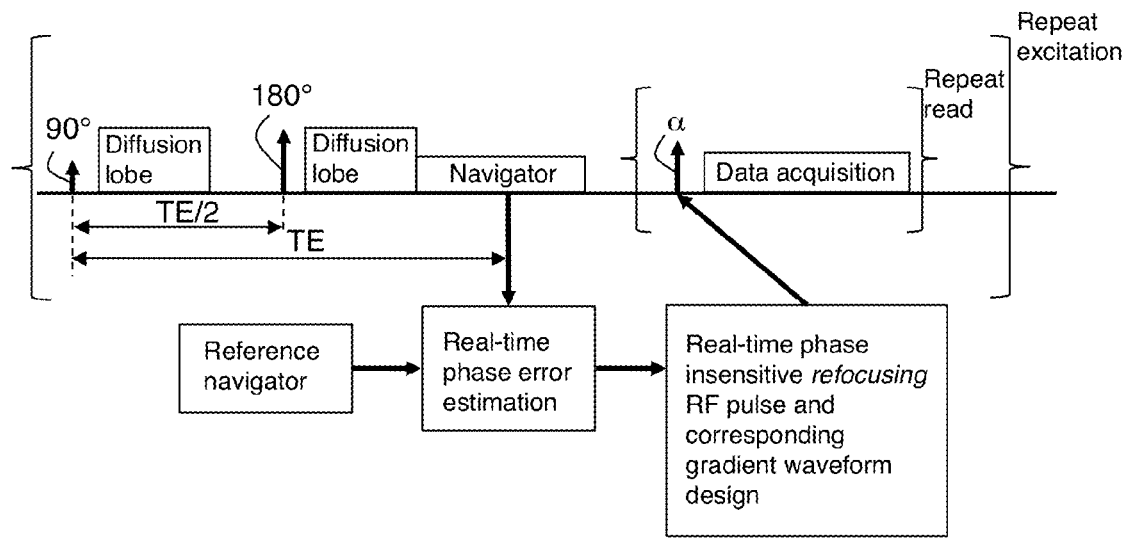

(3c) Similar to 3a, phase-insensitive 2D/3D refocusing pulses and corresponding gradient waveforms can be computed in real time for regular FSE and advanced FSE (CUBE/VISTA/SPACE) with a variable flip angle sweep (FIG. 2b). Here, the RF pulses are designed to maintain the CPMG condition in each point of space.

Figure 2C:
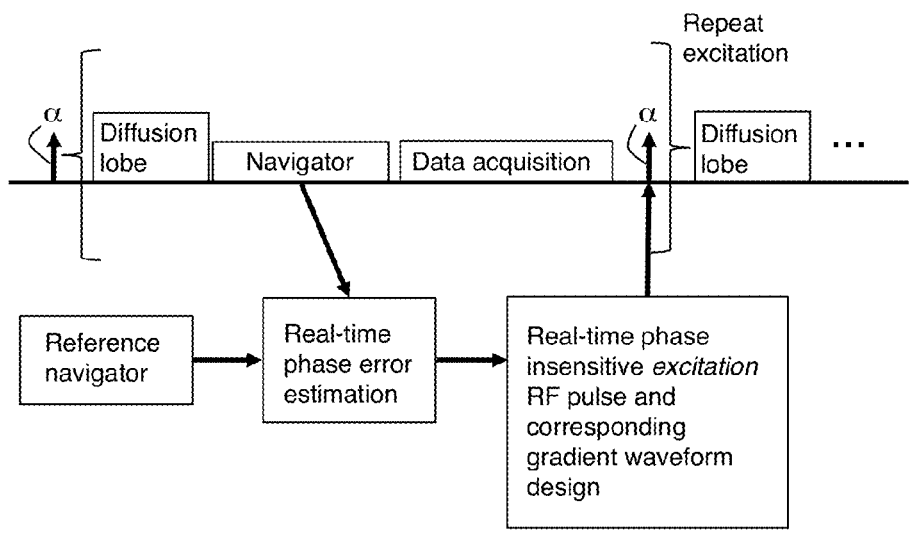
Figure 2D:
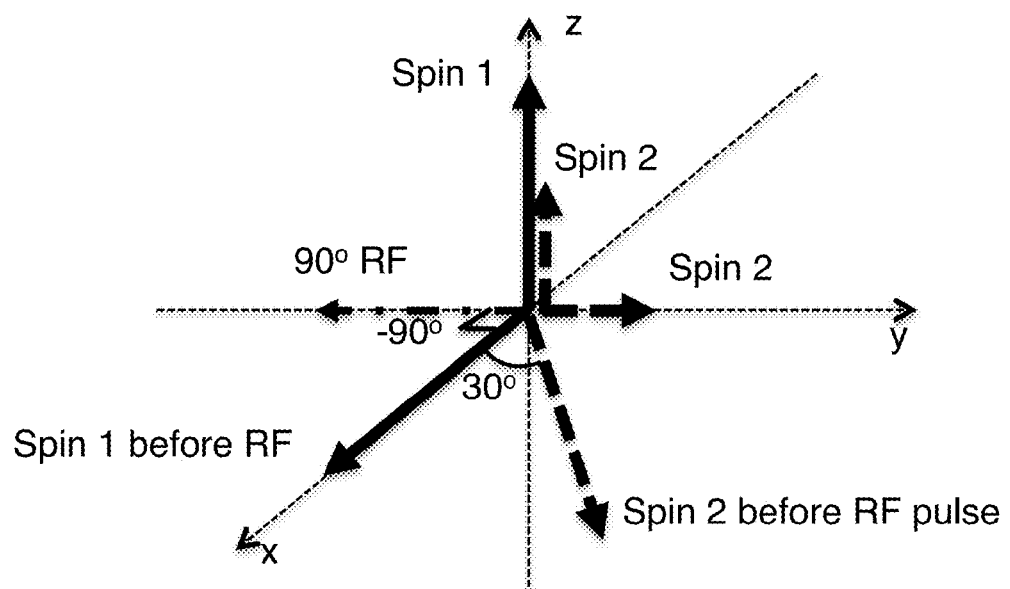
FIG. 2d shows an example of echo-reset spin geometry.

(3d) Similar to 3a, phase-insensitive 2D/3D excitation pulses and corresponding gradient waveforms are computed in real time for DW SSFP (FIG. 2c).

In these examples, reference navigator can refer to a navigator acquired at an earlier time (e.g., without the diffusion encoding). Depending on the desired resolution of the final image, a certain number of repetitions of excitation (including RF pulses, diffusion preparation, data acquisition) and/or data acquisition may be needed. The implementation of the 'data acquisition' module might be different in the cases considered above.

(4) Modifications to standard diffusion-weighted MR pulse sequence can be made to allow one to load compensatory RF and gradient waveforms in real-time for each of the $n_{RF}$ RF-transmit channels at minimum lag and to play them out in real time.

Although this example relates to an MR system from GE Healthcare, this approach is not vendor-specific. Any MR unit with a real-time operating system (e.g. Siemens) should be suitable for use with the present approach.

Some possible variations pertain to the way the 2D/3D navigator is performed (k-space trajectory, resolution, timing), what kind of 2D/3D pulses are used (e.g. multi-spokes, spirals, etc.), how the compensation pulses are played (e.g. single channel transmit vs. multi-channel parallel transmit), and whether phase-cancellation pulses (e.g. 3a) or phase-insensitive pulses (e.g. 3b, 3c, or 3d) are played out. Implementation details can vary between pulse sequences (Stejskal Tanner spin-echo vs. stimulated echo preparation, DE-SSFP, FSE, EPI, etc.) and from vendor to vendor. Other possible variations can be a combination of phase-correction gradients for linear phase correction and adaptive RF pulses for correcting residual non-linear phase errors. Partial compensation and subsequent mitigation of phase errors is another alternative for slower processing units that cannot keep up with the real-time processing of navigator data and especially the compensatory RF pulses and waveforms. If the phase error can be separated into predictable terms that can be estimated prior to the pulse sequence, such as brain pulsation over the RR-interval, and terms that are random, such as spontaneous head motion, the compensatory RF-pulses or the phase-insensitive RF pulses can be computed upfront, leaving only the unpredictable component (which is usually much less frequent).

B) Application to Diffusion-Weighted Steady State Free Precession MRI (Extended Example)

B1) Introduction

Diffusion-weighted MRI (DWI), Diffusion Tensor Imaging (DTI), or variants of these methods are essential diagnostic tools for neuroradiologists and are key components in almost every MR-imaging based neuroscience study. However, the image quality of typical DTI studies is poor and suffers from mediocre reproducibility. It would be timely and important for the neuroimaging community and health care professionals to get access to a vastly improved DTI method that offers better diagnostic confidence, reproducibility, and data fidelity.

2D single-shot echo planar imaging (ssEPI), a variant of echo planar imaging (EPI), is presently the state-of-the-art pulse sequence for acquiring DWI and DTI data sets in the clinical setting as well as for basic research. Despite the benefit of being fast and robust, 2D ssEPI suffers from distortions and lacks resolution. There have been major strides in mitigating distortions and dropping in-plane resolution to the sub-millimeter range, but even for the most technologically advanced centers, a slice thickness of 1.5 mm is the lower limit for 2D ssEPI. Furthermore, SNR decreases as slices become thinner. This problem is compounded for higher-b-value acquisitions, in which SNR is inherently lower, causing errors in image registration for correcting motion or eddy current-induced distortions. All of the above can't be fixed with parallel imaging, compressed sensing (CS), or multi-band excitation.

There is an increasing need in the DTI-user community to provide minimally distorted, high-resolution isotropic 3D diffusion scans. Specifically, benefits include:

a) Improved registration quality of DTI volumes;
b) Reduced test-retest-variability from lower distortion and the improved registration quality;

c) Reformatting along arbitrary planes, thus, following the common trend of volumetric acquisitions; and
d) Improved fidelity of fiber tracts.

Fiber tracking for presurgical planning is probably the most important clinical field of application for DTI. In order to perform brain surgery safely, neurosurgeons need to know the location of functionally critical brain regions: key areas in the gray matter and the connections (known as white matter tracts) between these areas that need to be preserved. Especially in the presence of tumors, tracts can be displaced randomly and it is of utmost importance to determine the presence and location of intact tracts. High fidelity tractography will allow the team of neuroradiologists and neurosurgeons to create a more complete patient-specific "roadmap" for use in neurosurgical planning. With a more complete picture of where the critical connections are and greater accuracy and precision, the neurosurgeon is better able to reduce the chance of postoperative morbidity, such as paralysis, difficulty with vision, or language problems.

Figure 3:
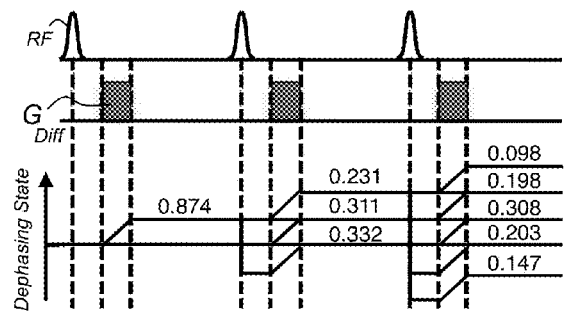
FIG. 3 shows an exemplary MRI sequence and accompanied signal evolution for diffusion-weighted steady-state free precession imaging (dwSSFP).

FIG. 3 shows an exemplary pulse sequence for dwSSFP. This gradient echo sequence has a short monopolar gradient (hence less susceptible to eddy currents than ssEPI). Each RF pulse splits the complex magnetization into 3 different dephasing states (coherences) plus one free induction decay (FID) state. The relative amount of spins put into these individual states depends on the flip angle used. The fraction of the original magnetization is often indicated by a label on top of the coherence.

Unlike conventional Stejskal-Tanner diffusion-weighting, where the 180° refocusing pulse of a spin-echo sequence is straddled by a pair of long diffusion-encoding gradients and which is plagued by strong eddy currents, in dwSSFP the diffusion-weighting is accomplished with relatively short monopolar gradient pulses (with much less eddy currents) and intermingled with the imaging process itself (FIG. 3). Thus, dwSSFP is a highly efficient scanning method, especially for 3D acquisitions. The time each coherence spends in the transverse and longitudinal state determines the diffusion-weighting.

While dwSSFP is a well-established sequence, it has not gained much clinical acceptance due to its greater motion sensitivity and the associated phase errors compared to ssEPI. This is unfortunate because high-resolution (<~1.5 mm$^3$) 3D diffusion imaging of the whole brain can only reliably be done with multi-shot acquisitions.

B2) Phase Errors in dwSSFP Imaging

Here, we describe a new phase error classification scheme for dwSSFP and introduce a new description of how phase errors propagate through coherences in dwSSFP. Within this framework we can better understand how motion affects dwSSFP and how we can reduce or eliminate phase error artifacts caused by motion.

Phase error classification: Phase errors in dwSSFP can be regarded as falling into two categories:

Type 1: shot-to-shot phase inconsistencies that can be retrospectively corrected.

Type 2: steady-state phase coherence errors that cause destructive interferences and unrecoverable magnitude loss, which can only be corrected prospectively.

Figure 4:
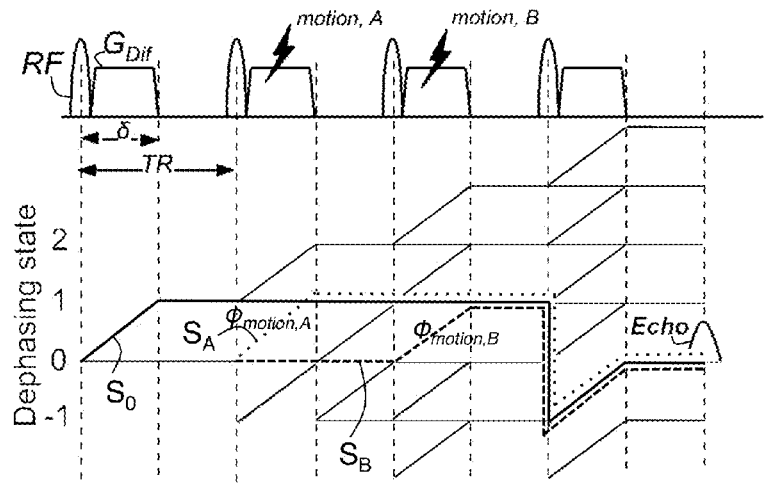
FIG. 4 shows the effect of motion on dwSSFP.
Figure 4:
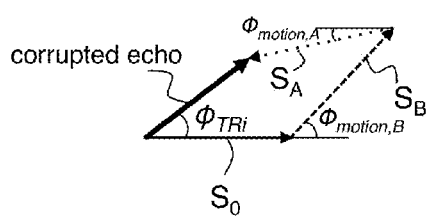
Figure 4:
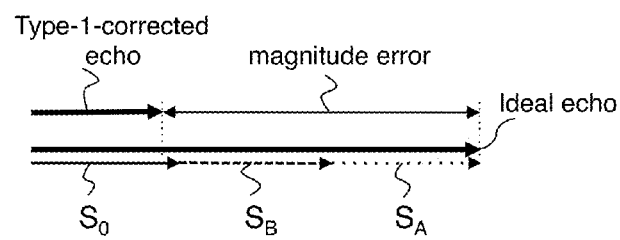

FIG. 4 demonstrates how phase errors—accrued during individual repetition time (TR) intervals—propagate through individual coherences and contribute to the echo. During each TR a different phase can be accrued due to unpredictable motion (e.g., spin coherences $S_0$, $S_A$, and $S_B$ can have different phases due to the motion). The phase from each TR is then distributed to the echoes formed in subsequent TRs (FIG. 4). Thus, unlike a spin-echo that results from a single coherence path, each echo in dwSSFP is the superposition of complex magnetization arising from multiple pathways with potentially different accrued phase. This is a known strength and causative for diffusion-weighting and potentially a source for new contrast information. However, in the presence of physiologic motion it leaves the net magnetization for each echo with an unpredictable phase and magnitude.

More specifically, at each TR the echo of a dwSSFP sequence is the weighted complex sum of all the zero-state coherences (i.e. those that cross the y=0 line on FIG. 4), as shown on the lower left of FIG. 4. Any phase accrual due to motion in a single TR gets propagated (through multiple RF pulses) into $3^n$ coherences until a subset (zero-state coherences) of them contribute to the echo in the $i^{th}$ TR. The complex addition of all zero-state coherences with different phase errors from individual TRs will give a net echo signal that has a net phase $\phi_{TRi}$ (Type 1 phase error) and which will be different for each TR. The $\phi_{TRi}$ can be eliminated retrospectively by phase conjugation (Type 1 correction). However, the individual, phase-perturbed coherences that contribute errors to the $i^{th}$ TR have accrued the phase term several TRs before. Thus, the signal magnitude will be lower due to destructive interferences (Type 2 phase error). The lower right part of FIG. 4 demonstrates how the phase errors can lead to a magnitude error in the echo signal. Depending on the amount of interference, the magnitude signal will deviate more or less from the dwSSFP signal that is expected in the absence of motion (Magnitude Error). Note that these Type 2 phase errors can only be fixed within the TR they are occurring in, prior to the next RF pulse.

For each echo one can measure the net phase with a navigator and take the conjugate of this phase for phase correction (Type 1 phase error correction). This will eliminate ghosts in the reconstructed images due phase errors that conflict with regular phase encoding for imaging.

However, the Type 1 phase correction cannot correct for the loss of magnitude caused by the destructive interference of previous coherences with differing motion-induced phases (Type 2 errors). Thus, in the presence of Type 2 errors, diffusion appears to be higher because the motion-perturbed dwSSFP signal is smaller than the dwSSFP signal without motion. To correct these errors, the phase error of each coherence needs to be corrected within the TR that this phase accrual actually occurs (Type 2 phase error correction). Hence, real time phase correction needs to be performed to prevent phase errors from getting passed on to subsequent dephasing states or otherwise the random phase between spins and RF acts like RF-spoiling.

Origin of motion-induced phase errors: Motion-induced phase errors can be divided into two categories, which can be easily separated:

A) Stochastic Rigid Body (RB) Motion: Translation and rotation during diffusion-weighting yield $0^{th}$ and $1^{st}$ order phase terms in the image domain. Since rigid body motion occurs randomly, these phase terms are non-deterministic.

B) Pulsatile Elastic Tissue Deformation—non-Rigid Body (nRB) Motion: Brain tissue deforms due to blood pulsation and a CSF pulse-wave that is moving distally through the ventricular system. Although spatially non-linear, this phase error is highly predictable over the cardiac cycle.

Being able to separate RB motion from nRB motion, and to predict non-linear phase over the cardiac cycle has significant impact on how DWI can be practiced. For dwSSFP this relates directly to how Type 1 and Type 2 errors can be corrected. Overall, this model leads to a dramatic simplification of the phase error problem and will have an unprecedented impact on many navigated diffusion methods, not just dwSSFP.

Before considering details of how adaptive RF pulses can compensate for phase error, it is helpful to consider a baseline non-adaptive pulse sequence for dwSSFP.

B3) Baseline (Non Adaptive) MR Pulse Sequence

Figure 5:
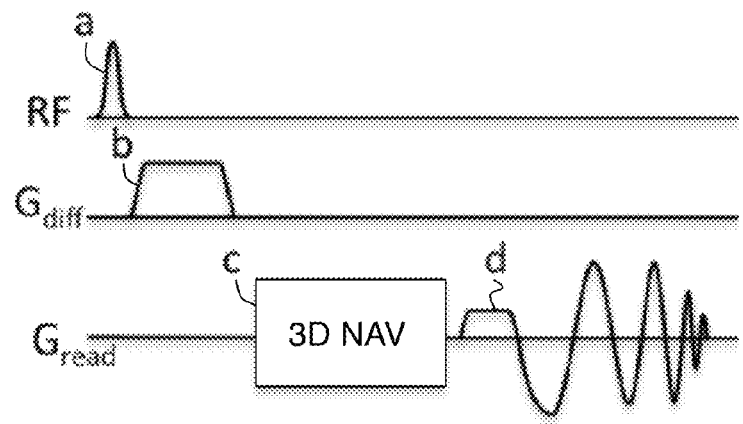
FIG. 5 schematically shows an exemplary dwSSFP pulse sequence with navigator for phase error estimation.

A baseline dwSSFP pulse sequence is shown on FIG. 5. This sequence includes (a) an RF pulse followed by (b) a monopolar diffusion-encoding gradient, (c) a 3D navigator, and then (d) a variable-density spiral (VDS) readout portion. The VDS is preferably a spiral-in type because in dwSSFP the echoes form closer to the end of each TR interval. To correct for motion-induced phase errors, we introduce a novel phase error model as follows.

Phase Error Model: The phase imparted to a DW MRI image comes from sources that are constant over all TRs (i.e. static), such as transmit/receive sensitivity, susceptibility, eddy currents, etc., and those that change every TR (i.e. dynamic), such as head motion and brain pulsatility. Thus, the basic model for the phase, $\Phi$, at a position, $\vec{r}$, in the image at the $i^{th}$ TR is:

$$\Phi(\vec{r},i)=\Phi_{static}(\vec{r})+\Phi_{dynamic}(\vec{r},i) \qquad (1)$$

where $\Phi_{static}$ and $\Phi_{dynamic}$ are contributions from the first and second sources, respectively.

Further, for practical reasons the static term, $\Phi_{static}$, is divided into 2 terms, one that is the same in the DW image and the un-weighted (b0 image), $\Phi_{b0}$, and another, $\Phi_{\Delta DW}$, that comes from eddy currents caused by the DW gradient. The dynamic term, $\Phi_{dynamic}$, from Eq. 1 is also divided into 2 parts, $\Phi_{rigid}$, and, $\Phi_{non-rigid}$, corresponding to rigid-body (RB) and non-rigid-body (nRB) motion, respectively. The model for the phase in the DW image then is, $$\Phi(\vec{r},i)=\Phi_{b0}(\vec{r})+\Phi_{\Delta DW}(\vec{r})+\Phi_{rigid}(\vec{r},i)+ \\ \Phi_{non-rigid}(\vec{r},i) \qquad (2)$$

Note that in multi-shot imaging, it is the last two terms of Eq. 2 that need to be corrected since they are the ones that change from TR to TR. However, notice that only the 3rd term has arbitrary dependence on the TR number i, and that the 4th term is due to cardiac pulsation and therefore correlated and repeatable.

Further details relating to phase error models for the brain are discussed in an article by O'Halloran et al. ("Model for the correction of motion-induced phase errors in multishot diffusion-weighted-MRI of the head: Are cardiac-motion-induced phase errors reproducible from beat-to-beat?", Magnetic Resonance in Medicine v68n2, August 2012, pp 430-40), hereby incorporated by reference in its entirety.

B4) Adaptive Motion Correction

One also needs to consider the effect of motion on the mismatch of individual interleaves and the loss in quality it inflicts on images. (In ssEPI this is usually done retrospectively, when the damage has been already done and without the ability to compensate spin history effects). Lengthy protocols and those with higher resolution are particularly prone to errors caused by motion. Therefore, real-time (RT) motion correction is preferably employed to alleviate these problems.

More specifically, a real-time data server can be used to process navigator images to detect 3D rigid head motion and adjust the scan orientation accordingly in real time. Here, the latest $N_{VDS}$ (3 or more) VDS interleaves (motion atom) (which are almost orthogonal to each other) can be used to estimate the 3D patient motion by comparing them against VDS interleaves that were synthesized from already-acquired VDSs or simply from a reference volume acquired earlier.

If p is the motion atom (i.e., k-space data vector for the acquired low-resolution, fully sampled and coil-combined VDS spiral part), f is the k-space data of the fully sampled, low resolution 3D reference set, $R(\alpha)$ is the head rotation operation, and D is the degridding operation that resamples the Cartesian k-space data onto the VDS k-space trajectory (which is typically done by fast interpolation), the head orientation quaternion $\alpha$ is found from $$\text{argmax}_\alpha\{\rho[|p|,DR(\alpha)|f|]\}. \qquad (3)$$

For our dwSSFP data the Pearson correlation $\rho$ has been found to be convex over the tested range of $\pm 20°$ around the current head orientation estimate. Therefore, the search for the optimal head orientation can be done rapidly using the Levenberg-Marquardt optimization method. The search angular granularity is limited to $0.25°$ which is deemed sufficient for diffusion gradient precision.

Here, registration of the head orientation is performed on the magnitude of k-space to decouple rotation from translation correction. Once the orientation angles are found, sub-voxel-resolution translation estimation is performed using the linear phase terms in k-space (not to be confused with RB phase in image space). This decoupling method is commonly used for PROPELLER (Periodically Rotated Overlapping ParallEL Lines with Enhanced Reconstruction) motion correction. Since the VDS plane is fully sampled at the k-space center, coil combination in image projection space can be performed. This reduces the required computations by a factor equal to the number of coils used and avoids bias from coil sensitivity.

Figure 6:
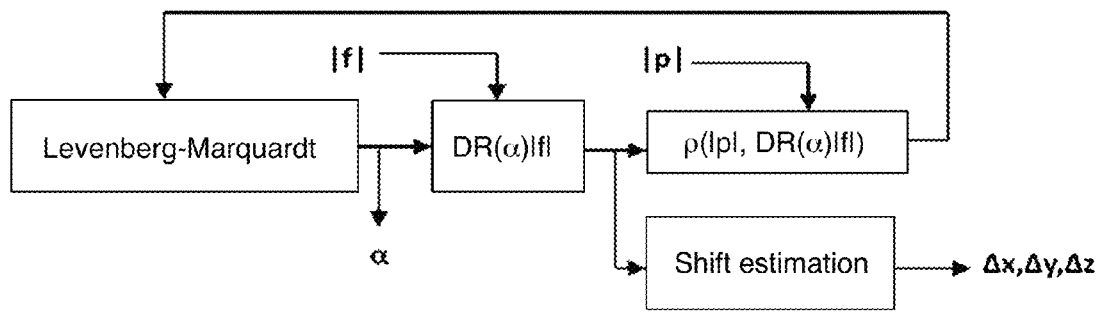
FIG. 6 shows a flow chart for determining rigid body motion parameters from acquired MRI data.

FIG. 6 is a flow chart schematically depicting a process by which rigid-body motion parameters can be computed from the most-recently acquired VDS spiral projections.

The temporal footprint for this motion detection is TR*$N_{VDS}$. It has been shown recently that 3 projections are sufficient to perform high quality motion correction. To improve robustness of our motion detection we will use $N_{VDS}$>3 (default: 10) with increasing importance weighting towards the most recently acquired interleaves.

After the changes in patient location have been determined on a GPU server, the updated location can be submitted to the MR sequencer via UDP (universal data protocol) e.g., on an Inifiniband® connection. From the event of motion occurring to adapting to motion it is expected that no more than 10 ms+$N_{VDS}$*TR will be needed for an MR system to respond to an impulsive pose change. This approach is sufficient to address the most common form of motion: drifting motion at moderate speed. By looking at the navigator intensity, episodes of short jerking motion can be detected with even shorter time lag, but these views plus 2-4 views ($N_{reacq}$) thereafter (to address potential transients of the SSFP signal) can simply be reacquired. Rather than using retrospective correction, this approach adapts to motion as it occurs in real time. This avoids spin history effects, which can be particularly problematic in dwSSFP as well as in thin-slice 2D EPI. Adaptive motion correction also keeps the diffusion-encoding directions aligned with the originally prescribed anatomy, which avoids ambiguous directional diffusion-encoding of different VDS interleaves and tedious post-processing.

B5) Real Time Correction of Type 2 Phase Errors

Rationale: Type 1 phase error correction addresses unwanted fluctuations of the net phase error from all coherences in the zero dephasing state (both RB and nRB). While this correction improves reconstruction by retrospectively removing the unwanted phase, it does not address the fluctuations of the dwSSFP signal magnitude due to destructive interferences induced by coherence pathways with differing phase (Type 2 phase error), which essentially acts like RF spoiling.

B5.1) Exemplary Design Specifications and Requirements:

A dwSSFP pulse sequence with real-time RB and nRB phase correction capabilities is considered. This sequence can provide isotropic high-resolution ($\leq 1$ mm$^3$) whole brain coverage in a total scan time of less than 15 min for 25 encoding directions. At a b-value of 1,000 s/mm$^2$, the average SNR over all brain voxel for one diffusion-weighted image can be no less than 4. A low-resolution phase-contrast (PC) scan can be integrated into the autoprescan routine of the sequence and take no longer than 45 sec.

Figure 7:
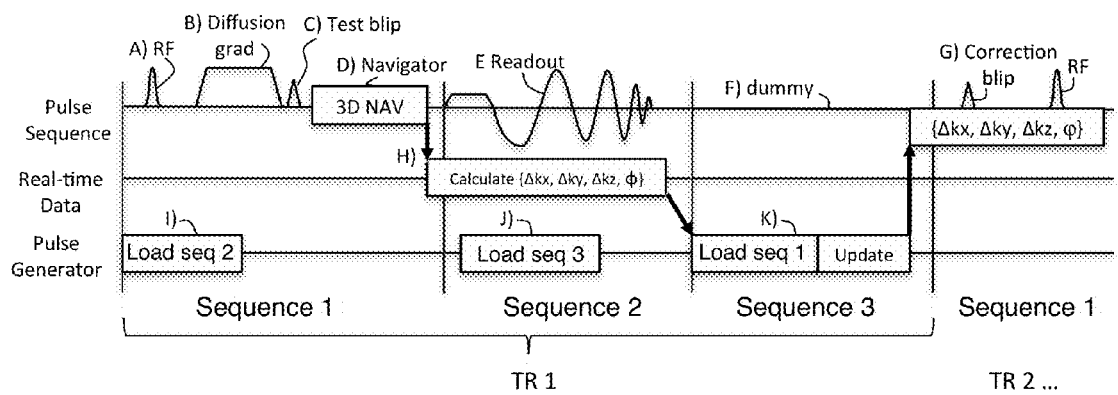
FIG. 7 shows an exemplary MRI sequence with real-time linear phase error correction module in dwSSFP imaging.

B5.2) MR Pulse Sequence Development:

The baseline dwSSFP pulse sequences considered above can be augmented with real-time phase-correction features, e.g., as shown in FIG. 7. Specifically, this dwSSFP pulse sequence includes the following added features: (1) real-time calculation of RB phase error terms; (2) a "test blip" to perturb the spin phase relative to the RF pulse phase for testing purposes; (3) RB motion phase correction blips; (4) PC-MRI-based pulsatile displacement measurement as part of autoprescan of dwSSFP; and (5) conjugate-phase RF pulse of $\leq 8$ ms duration to compensate nRB phase errors.

More specifically, FIG. 7 shows a schematic of the RT dwSSFP sequence, including (A) RF pulse, (B) diffusion-encoding gradient, (C) test blip gradient to induce a known phase error for testing purposes, (D) 3D navigator used to measure the RB phase errors, (E) VDS readout, (F) optional dummy sequence, and (G) the blip correction gradient used to correct phase errors due to rotation. The optional dummy sequence can be included to throttle down the execution of the next TR interval and to ensure that the update code executes after the not-yet optimized real-time update (of gradient and RF waveforms) arrive. Using an Infiniband® connection to the sequencer and the volume reconstruction engine of the scanner directly, the dummy sequence duration should end up being 2 ms or less.

B5.3) Correcting Type 2 Errors from RB Motion:

RB motion phase is the major contributor to phase errors in diffusion-weighted imaging. In dwSSFP, any phase the transverse magnetization accrues in the $i^{th}$ TR prior to the next RF pulse will be propagated over several coherence paths into subsequent echoes over the $i^{th}+1$ to the $i^{th}+m$ TR period (FIG. 4). In the present approach, the RB navigator parameters are calculated in real time and fed back into the scanner using a real time data server.

Here, the $0^{th}$-order phase offset will be used to set the phase of both the next RF pulse and data acquisition demodulation frequency. In the steady state, the RF phase is $\pi/2$ offset from the phase of the refocused echoes, so if the measured $0^{th}$-order phase offset from the $i^{th}$ TR is $\theta_i$, then the phase of the next RF pulse, $\phi_{i+1}$, has to be $$\phi_{i+1} = \theta_i - \pi/2 \quad (4)$$

to maintain the steady state. Similarly, correction gradient blips (FIG. 7) can be played along each of the principal axes to compensate for $1^{st}$ order phase errors along the x, y, and/or z directions, which were determined for this TR by the 3D navigator. Failure to comply with this condition would otherwise lead to destructive interferences of coherences when they return to the zero dephasing state (y=0 axis in FIGS. 3-4) to form an echo.

Figure 8:
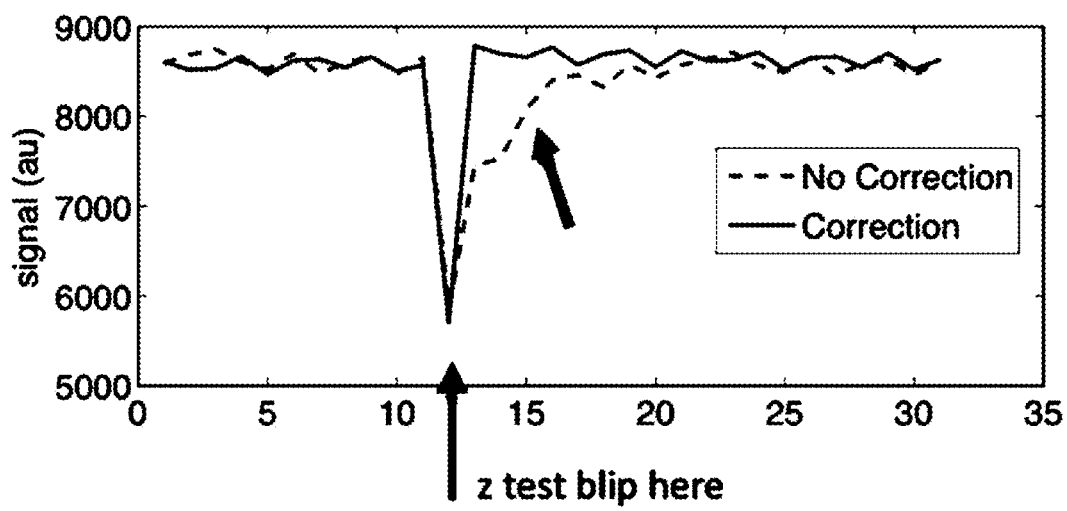
FIG. 8 shows results of an experimental proof of concept for correction of magnitude errors.

We have performed a pilot phantom study with an early variant of the sequence diagrammed in FIG. 7, where we intentionally created known phase perturbations by test blip gradients (FIG. 7, C) to investigate how the steady state signal is perturbed and how well it can be corrected. The preliminary real-time results are extremely encouraging and demonstrate the feasibility of measuring RB errors and correcting for RB phase errors. Stabilizing echoes in this fashion will be a quantum leap for dwSSFP. FIG. 8 shows the results from this experiment. The signal magnitude at the end of the navigator readout is plotted vs. TR number. Because the navigator is refocused this is the signal at the center of k-space (the DC term). At TR #12 a test blip gradient is played out to perturb the spin phase relative to the RF phase. In the very same TR, the signal drops because the navigator is no longer refocused to the k-space center. The dashed curve demonstrates how this phase error between spins and subsequent RF pulses trickles through all the coherences and reduces the dwSSFP signal in subsequent TRs. Only after TR #20 has the system gone back into steady state again. The solid line shows that when the phase error is actually detected by the 3D navigator in the TR where it occurs and a correction blip is played prior to the next RF, the signal returns to steady state immediately.

A residual dip in the steady state signal is present when RT phase correction is active (solid line, arrow). This dip is attributed to motion-induced linear phase errors that cause the navigator not to be refocused back to the k-space center. However, this effect can be taken care of via Type 1 correction by either reverse shifting that interleave in the reconstruction or by real-time compensation blips played out prior to the VDS used for imaging.

Figure 9:
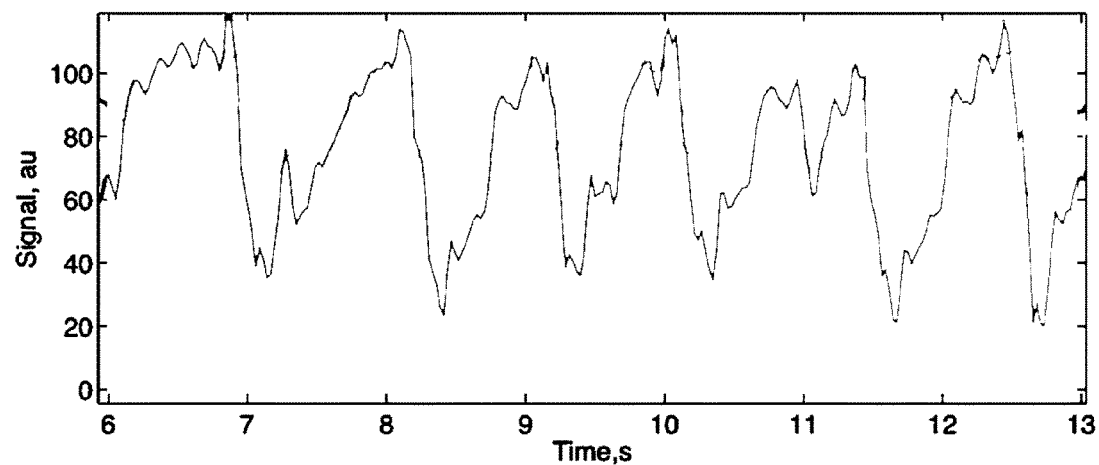
FIG. 9 shows an example of the effect of Type II error on dwSSFP imaging signals.

B5.4) Correcting Type 2 Errors from nRB Motion:

In FIG. 9 the maximum dwSSFP signal magnitude from the 3D navigator acquired in a healthy volunteer is plotted vs. time for a subset of the dwSSFP scan. The periodic fluctuation of the signal is a result of Type 2 errors caused by pulsatile brain motion due to the patient's heartbeat, which cause phase errors between spins and subsequent RF phase. This quasi-random phase of the spins is comparable to the quadratic phase increment in RF spoiling. Hence, the dwSSFP signal is lower in the presence of motion. The motion is more pronounced in the cranio-caudal (or superior/inferior (S/I)) direction than in the left/right (L/R) or anterior/posterior (A/P) directions. The signal acquired with diffusion-encoding along the feet/head or S/I direction (plotted in FIG. 9) is particularly plagued by the motion-induced loss of signal magnitude (Type 2 error). The relatively greater signal loss along this direction compared to the other directions biases apparent diffusion coefficient (ADC) measurements. The signal loss for dwSSFP with diffusion-encoding along the S/I-direction has been previously reported in the SSFP literature, but its cause, (i.e., Type 2 errors), has not previously been described.

While RB phase errors likely represent the majority of the Type 2 phase error (~10× larger than nRB), our pilot data indicate that nRB motion caused by cardiac pulsation can't be fully neglected. This motion is particularly noticeable around the brainstem & $4^{th}$ ventricle.

Note that the 3D navigator and the Type 2 RB correction measure and correct for the $0^{th}$ and $1^{st}$ order phase errors of both the RB and nRB motion. Thus, the target RF phase of the Type 2 nRB motion correction will have the $0^{th}$ and $1^{st}$ order phase removed prior to computing the RF waveforms (see next section).

B5.4.1) Conjugate-Phase RF Pulses:

To prospectively correct the Type 2 phase error from nRB motion in each TR, we introduce a radically different phase correction approach. More specifically, a low-resolution multi-dimensional RF pulse that demonstrates a phase pattern which is conjugate to the one caused by nRB motion is provided. Since the phase will also depend on the diffusion-encoding direction, the latter needs to be factored in as well when designing the RF pulse.

B5.4.2) RF Pulse Design:

The small tip angle approximation (STA) equates the "setting" of the desired magnetization at the voxel $r=(x,y,z)^T$ by the $l^{th}$ transmit coil to the Fourier transform of the RF pulse waveform, $B_1(t)$, using the following expression:

$$M^l(r)=j\gamma M_0(r)T^l(r)\int B_1^l(t)\exp(-jk(t)\cdot r)dt \quad (5)$$

where k(t) is the trajectory in excitation k-space generated by the gradient waveforms played during the RF transmission of the RF pulse. Discretizing in space and time, we may rewrite Eq. 5 into:

$$m^l=\text{diag}(t^l)AB^l, \quad (6)$$

with $a_{ij}=\Delta t \cdot j\gamma M_0(r_i)\exp(-jk(t_j)\cdot r_i)$, (7)

Thus, for a set of $n_c$ transmit coils the net transverse magnetization produced by the sum of all coils is:

$$m = \sum_{l=1}^{n_c} \text{diag}(t^l)Ab^l = A_{full}b_{full}. \quad (8)$$

Given a desired excitation pattern $m_{des}$, the RF pulses can be designed as:

$$b_{full}=\text{argmin}\{\|A_{full}b_{full}-m_{des}\|+\lambda\|b_{full}\|\}, \quad (9)$$

where the second term controls for excessive specific absorption rate and is used routinely in the parallel transmit (pTx) community. Eq. 9 represents a full-fledged pTx approach.

Figure 10:
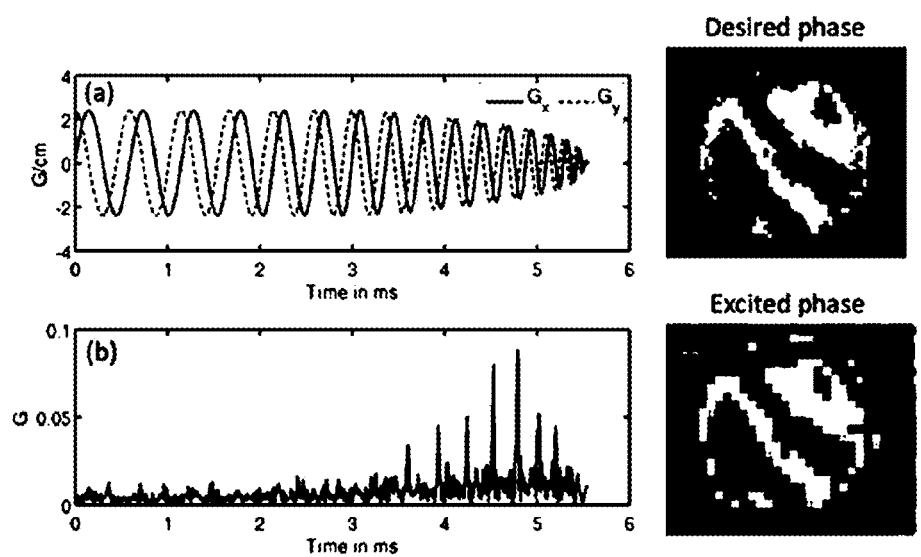
FIG. 10 shows an example of 2D RF and corresponding gradient waveforms that produces an excited phase map that closely matches a desired phase error map.

In our case, we desire a flat profile for $M_{des}$ across the FOV, while the phase should resemble the conjugate profile of the nRB phase. For the low tip angles used in dwSSFP, the STA approach suffices and no iterative Bloch solutions will be necessary. To reduce the complexity of the approach, only the body coil for RF transmit can be used in the above approach (i.e. $n_c=1$). Using Eq. 9, $n_c=1$, and a spiral-in gradient waveform, FIG. 10 shows a preliminary example of a conjugate phase RF pulse that sets a desired spatial phase profile at constant flip angle ($|m_{xy}(r)|=\text{const}$). Here (b) is the RF waveform, (a) is the corresponding gradient waveform for spiral-in trajectory, (c) is the desired phase profile, and (d) is the excited phase (as obtained from a Bloch simulator).

B5.4.3) How Much Coverage in Excitation k-Space is Needed?

We performed simulations to determine the excitation matrix size required to correct most of the non-linear phase error. A conjugate gradient algorithm was used to minimize Eq. 9 and determine the excitation profile over a region of interest. The experiment was repeated for all 10 cardiac phases of a central axial and a sagittal slice with different excitation matrix sizes ($2^3$ to $36^3$).

Figure 11:
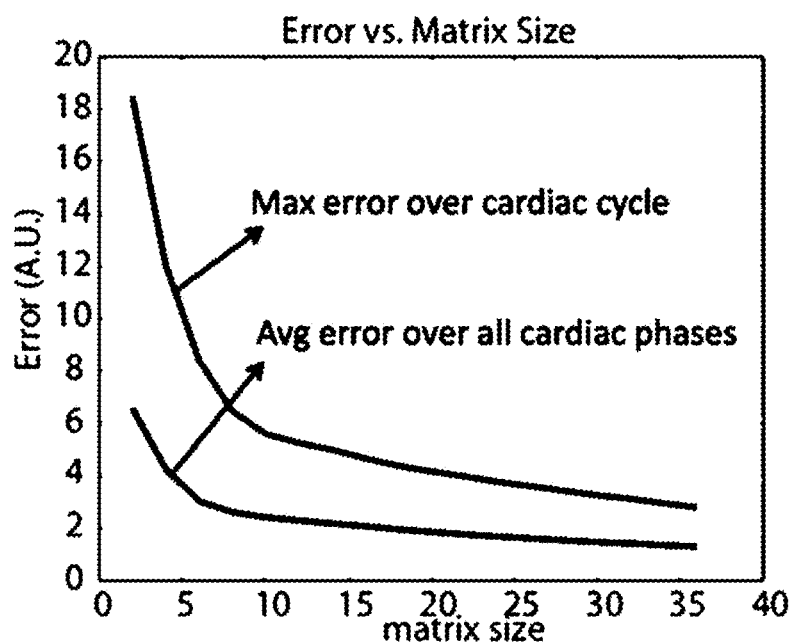
FIG. 11 shows the effect of spatial resolution (as determined by matrix size) on excitation error.

The results are shown on FIG. 11, which shows error in the design of the 3D RF pulse vs. the matrix size in 3D. Our results suggest that even for the regions with the most phase error, a $6^3$ to $8^3$ excitation k-space is sufficient to reap most of the benefits of a high-resolution excitation pulse while avoiding the drawbacks of long RF pulses (off-resonance sensitivity, relaxation effects, etc.). When the matrix size exceeds approximately $6^3$ to $10^3$ there are diminishing returns in estimating the non-linear phase error from increasing the resolution.

Various excitation gradient waveform can be employed. For trajectories with a very small k-space extent (in our case roughly from $-0.18$ to $0.18$ cm$^{-1}$) the gradient waveform will be largely governed by slew rate and therefore Rosette-like trajectories, which keep a relatively high velocity throughout the trajectory, may be promising.

Figure 12:
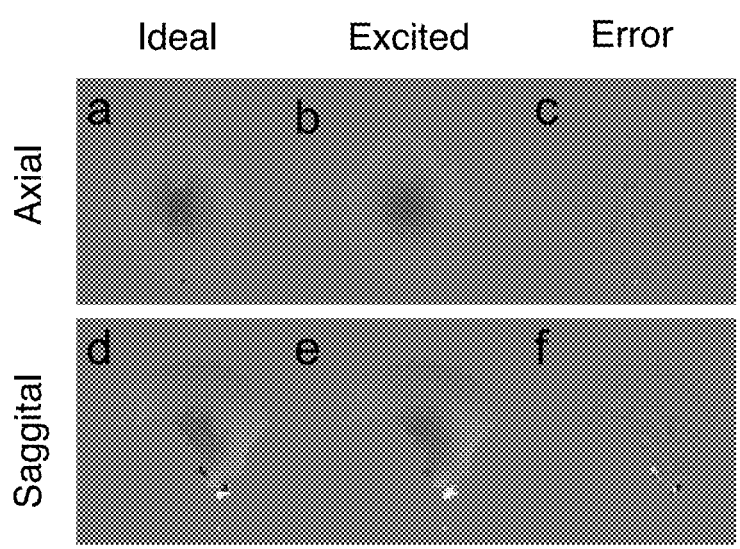
FIG. 12 experimentally shows the effect of using adaptive RF pulses in connection with dwSSFP imaging.

FIG. 12 shows ideal phase maps (a, d) for the design of multi dimensional RF pulses that were taken from real measurements of the nRB during systole in a volunteer. Actual profiles with a RF pulse design on an 8×8×8 matrix in excitation k-space are shown (b, e) with difference maps from the ideal (c, f). This shows that a very modest matrix size is sufficient to correct nRB phase errors. These results demonstrate that the residual error—even during systole—is very small.

B5.4.4) Estimation of nRB Displacement:

The brain tissue displacement over the entire cardiac cycle can be measured by a phase-contrast calibration scan that can be part of the regular initial autoprescan procedure of the dwSSFP sequence. Since the calibration only needs single-shot low-resolution data, the total time for calibration is not significant (i.e. <45 sec). Based on the velocities $V(r, t)=[V_x(r, t), V_y(r, t), V_z(r, t)]^T$ measured, one can compute a displacement vector field and from that the non-linear phase error (excluding the $0^{th}$ and $1^{st}$ order terms) can be estimated for each diffusion-encoding direction, $G_{Dif}$, and the i-th cardiac bin according to:

$$\Phi_{non\text{-}rigid}(r,i)=\gamma\int_0^\delta G_{Dif}(\tau)\cdot V(r,\tau)\cdot\tau d\tau \quad (10)$$

where $\delta$ is the duration of $G_{Dif}$.

B5.4.5) Per-TR nRB Type 2 Phase Correction:

Since Type 2 correction requires independent resetting of the nRB phase at every TR, designing these multi-dimensional RF pulses in real-time (tens of milliseconds) and uploading them to the sequencer in time can be technically challenging. Thus, to reduce the need of real-time RF pulse design, pre-calculated RF-pulses can be employed. More specifically, RF pulses can be pre-calculated using phase-contrast calibration data acquired previously during auto-prescan (see above). For a given cardiac phase and diffusion-encoding direction, we can then swap in (in real-time) the matching conjugate phase RF pulse from an RF-pulse lookup table stored at the MR sequencer.

The invention claimed is:

1. A method of performing diffusion weighted magnetic resonance imaging (MRI), the method comprising:
   a) operating an MRI system in order to provide a navigator image of an imaging subject, wherein the MRI system comprises:
      an MRI system processor,
      a main magnet configured to provide a main magnetic field,
      one or more gradient magnets configured to provide controllable magnetic field gradients, and
      one or more radio-frequency (RF) sources of RF emission configured to provide controllable RF pulses;
   b) computing, in real time with the MRI system processor, a phase error map from the provided navigator image;
   c) determining, in real time with the MRI system processor, an adaptive RF pulse from the computed phase error map that compensates for phase errors of the computed phase error map;
   d) determining, in real time with the MRI system processor, one or more adaptive magnetic field gradients corresponding to the computed phase error map and the determined adaptive RF pulse;
   e) providing the determined adaptive RF pulse to the imaging subject with the one or more sources of RF emission and simultaneously providing the determined adaptive magnetic field gradients to the imaging subject with the one or more gradient magnets; and f) performing diffusion-weighted MRI of the imaging subject by performing steps a) through e) above in succession one or more times while recording, displaying and/or storing the diffusion weighted magnetic resonance imaging scan results.

2. The diffusion weighted MRI method of claim 1, wherein the adaptive RF pulse compensates for the phase errors present within the computed phase error map by making a post-pulse phase distribution within the imaging subject substantially uniform.

3. The diffusion weighted MRI method of claim 1, wherein the adaptive RF pulse compensates for the phase errors present within the computed phase error map by making an RF tip axis map substantially equal to the computed phase error map.

4. The diffusion weighted MRI method of claim 3, wherein one or more of the adaptive RF pulses comprise phase insensitive echo-reset pulses configured for a phase insensitive diffusion encoding preparation.

5. The diffusion weighted MRI method of claim 3, wherein one or more of the adaptive RF pulses comprise refocusing pulses configured for fast spin echo imaging.

6. The diffusion weighted MRI method of claim 3, wherein one or more of the adaptive RF pulses comprise excitation pulses configured for diffusion-weighted steady state free precession imaging.

7. The diffusion weighted MRI method of claim 1, further comprising:

determining with the MRI system processor one or more adaptive magnetic field gradients that compensate for a linear error in the computed phase error map; and providing the one or more adaptive magnetic field gradients to the imaging subject with the gradient magnets during the diffusion weighted MRI scan.

8. The diffusion weighted MRI method of claim 1, wherein the one or more RF sources comprise two or more RF sources configured to operate in parallel with one another.

9. The diffusion weighted MRI method of claim 1:

wherein the phase errors present within the computed phase error map include motion phase errors due to motion of the imaging subject;

wherein the motion phase errors include both predictable motion phase errors and random motion phase errors;

further comprising providing an estimate of the predictable motion phase errors with the MRI system processor;

wherein compensation of the random motion phase errors is provided by the adaptive phases of RF pulses and the adaptive magnetic field gradients; and wherein compensation of the predictable motion phase errors is provided by pre-computed RF pulses and pre-computed magnetic field gradients that are determined from the estimate of the predictable motion phase errors by the MRI system processor.

* * * * *